US012796197B2

(12) United States Patent
Kim

(10) Patent No.: US 12,796,197 B2

(45) Date of Patent: Nov. 10, 2026

(54) DISPLAY APPARATUS

(71) Applicant: LG DISPLAY CO., LTD., Seoul (KR)

(72) Inventor: Yonghee Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 495 days.

(21) Appl. No.: 18/354,554

(22) Filed: Jul. 18, 2023

(65) Prior Publication Data

US 2024/0258481 A1 Aug. 1, 2024

(30) Foreign Application Priority Data

Jan. 31, 2023 (KR) ........................ 10-2023-0012731

(51) Int. Cl.
*H10H 20/857* (2025.01)
*H10W 90/00* (2026.01)

(52) U.S. Cl.
CPC .......... *H10H 20/857* (2025.01); *H10W 90/00* (2026.01)

(58) Field of Classification Search
CPC .... H10H 20/857; H10H 29/49; H10H 29/857; H10H 29/922; H10H 29/942; H10W 90/00; G02F 1/133308; G02F 1/133305; H10K 77/111; H10K 2102/311; G09F 9/301
See application file for complete search history.

(56) References Cited

U.S. PATENT DOCUMENTS

| | | | |
|---|---|---|---|
| 9,356,087 B1 | 5/2016 | Lee et al. | |
| 10,462,896 B1 | 10/2019 | Kwon et al. | |
| 10,541,293 B2 | 1/2020 | Kim | |
| 10,645,802 B2 | 5/2020 | Kwon et al. | |
| 10,756,153 B2 | 8/2020 | Kim | |
| 10,779,400 B2 | 9/2020 | Kwon et al. | |
| 10,896,948 B2 | 1/2021 | Lee et al. | |
| 11,140,492 B2 | 10/2021 | Jang et al. | |
| 11,750,979 B2 | 9/2023 | Jang et al. | |
| 2014/0217382 A1* | 8/2014 | Kwon | H10K 50/8426 257/40 |

(Continued)

FOREIGN PATENT DOCUMENTS

| | | |
|---|---|---|
| CN | 115206192 A | 10/2022 |
| CN | 115331564 A | 11/2022 |

(Continued)

OTHER PUBLICATIONS

Japan Patent Office, Notice of Allowance, Japanese Patent Application No. 2024-000155, Mar. 18, 2025, six pages.

(Continued)

*Primary Examiner* — Latanya N Crawford Eason

(74) *Attorney, Agent, or Firm* — Fenwick & West LLP

(57) ABSTRACT

Disclosed is a display apparatus including: a display panel including a display area and a non-display area surrounding the display area, wherein the non-display area has a bendable area; a first backplate supporting the display area of the display panel; and a second backplate spaced apart from the first backplate and supporting a portion of the non-display area of the display panel, wherein the display panel includes: a substrate; an adhesive buffer layer disposed on the substrate and in an entirety of each of the display area and the non-display area; and first signal lines disposed on the adhesive buffer layer and extending across the bendable area, wherein the adhesive buffer layer is disposed on an upper surface of the substrate and in the bendable area.

19 Claims, 6 Drawing Sheets

(56) References Cited

U.S. PATENT DOCUMENTS

| | | | | |
|---|---|---|---|---|
| 2016/0172427 | A1 | 6/2016 | Lee et al. | |
| 2016/0240605 | A1 | 8/2016 | Lee et al. | |
| 2018/0182829 | A1 | 6/2018 | Shin et al. | |
| 2018/0233552 | A1 | 8/2018 | Lee et al. | |
| 2019/0035869 | A1 | 1/2019 | Kim | |
| 2019/0245156 | A1 | 8/2019 | Kwon et al. | |
| 2020/0028100 | A1 | 1/2020 | Furukawa et al. | |
| 2020/0029423 | A1 | 1/2020 | Kwon et al. | |
| 2020/0119118 | A1 | 4/2020 | Kim | |
| 2020/0154214 | A1 | 5/2020 | Jang et al. | |
| 2020/0253035 | A1 | 8/2020 | Kwon et al. | |
| 2020/0303490 | A1* | 9/2020 | Tomioka | H10K 50/844 |
| 2021/0043868 | A1* | 2/2021 | Kishimoto | H10K 59/128 |
| 2021/0118336 | A1* | 4/2021 | Jin | H10K 77/111 |
| 2021/0184139 | A1 | 6/2021 | Zhang et al. | |
| 2021/0400396 | A1 | 12/2021 | Jang et al. | |

FOREIGN PATENT DOCUMENTS

| | | | |
|---|---|---|---|
| JP | 2019109291 | A | 7/2019 |
| JP | 2021503093 | A | 2/2021 |
| KR | 10-2018-0047167 | A | 5/2018 |
| KR | 10-2020-0044399 | A | 4/2020 |
| KR | 10-2340729 | B1 | 12/2021 |
| KR | 10-2022-0093271 | A | 7/2022 |
| WO | WO 2017/142078 | A1 | 8/2017 |

OTHER PUBLICATIONS

European Patent Office, Extended European Search Report, European Patent Application No. 23198766.0, Feb. 14, 2024, nine pages.

Taiwan Intellectual Property Office, Office Action, Taiwanese Patent Application No. 112135376, Jan. 4, 2024, 11 pages.

* cited by examiner

DISPLAY APPARATUS

CROSS-REFERENCE TO RELATED APPLICATION

This application claims priority from Korean Patent Application No. 10-2023-0012731 filed on Jan. 31, 2023 in the Korean Intellectual Property Office, and all the benefits accruing therefrom under 35 U.S.C. 119, the contents of which in its entirety are herein incorporated by reference.

BACKGROUND

Field

The present disclosure relates to a display apparatus. More specifically, the present disclosure relates to a display apparatus capable of reducing stress applied to signal lines in a bendable area of a display panel while reducing a bezel size.

Description of Related Art

Specific examples of flat panel display apparatuses include liquid crystal display apparatuses, organic light-emitting display apparatuses, inorganic light-emitting display apparatuses, and quantum dot display apparatuses.

Efforts are being made to reduce a width of a non-display area (or a bezel area) of a display apparatus that is visible to a user in order to provide a sense of immersion and aesthetics to the user.

Recently, a flexible display apparatus including a display panel using a flexible substrate has been developed, and has the advantage of being able to be designed in various shapes.

In the flexible display apparatus, a portion of a non-display area of the display panel may be folded or bent so as to be disposed under a display area of the display panel, such that the width of the non-display area (or the bezel area) of the display apparatus can be reduced.

SUMMARY

Various signal lines of the display panel are disposed in the non-display area of the display panel. The signal lines extend across a bendable area as an area where the display panel is bent.

In a display apparatus that is being recently developed to minimize the bezel area and to implement a thin display apparatus, the bendable area of the display panel is bent at a smaller radius of curvature and thus has a smaller area size. This increases the stress applied to the signal lines, which may cause cracks and disconnection defects in the signal lines.

Therefore, a new scheme to reduce the stress applied to the signal lines in the bendable area of the display panel is needed.

Accordingly, the inventors of the present disclosure have invented a display apparatus capable of reducing stress applied to signal lines in a bendable area of a display panel.

A technical purpose according to an embodiment of the present disclosure is to provide a display apparatus capable of reducing stress applied to signal lines in a bendable area of a display panel while reducing a bezel area.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means shown in the claims or combinations thereof.

An aspect of the present disclosure provides a display apparatus comprising: a display panel including a display area and a non-display area surrounding the display area, wherein the non-display area has a bendable area; a first backplate supporting at least the display area of the display panel; and a second backplate spaced apart from the first backplate and supporting a portion of the non-display area of the display panel, wherein the display panel includes: a substrate; an adhesive buffer layer disposed on the substrate in the display area and the non-display area; and first signal lines disposed on the adhesive buffer layer and extending across the bendable area, wherein the adhesive buffer layer is disposed on an upper surface of the substrate in the bendable area.

Details of other embodiments are included in the detailed descriptions and drawings.

According to the embodiments of the present disclosure, the adhesive buffer layer having a lower storage modulus than that of the polymer material of the substrate is disposed between the substrate and the signal line and in the bendable area of the display panel. Thus, when bending the bendable area of the display panel, slip or shear deformation may occur between the substrate and the signal line, and the stress applied to the signal line may be reduced. Accordingly, cracks and disconnection defects of the signal lines RL may be reduced or prevented.

According to the embodiments of the present disclosure, in a state where the second backplate is attached to the lower surface of the first backplate, the distance between the end of the first backplate and the end of the second backplate in the non-display area may be maintained to be to 10 μm or smaller. Thus, the stress applied to the signal lines RL may be reduced.

According to the embodiments of the present disclosure, the spacing between the end of the planarization layer in the non-display area and the end of the first backplate in the non-display area may be 60 μm or greater, thereby preventing a larger amount of stress than an amount of stress applied to the signal lines in the bendable area from being applied to the signal lines at the end of the planarization layer.

In another embodiment, a display apparatus comprises a display panel including a first area, a second area, and a third, bendable area between the first area and the second area, a first backplate supporting the first area of the display panel, and a second backplate spaced apart from the first backplate and supporting the second area of the display panel, wherein the display panel includes a substrate, an adhesive buffer layer disposed on the substrate in the third, bendable area of the display panel, and first signal lines disposed on the adhesive buffer layer and extending across the third, bendable area.

Effects of the present disclosure are not limited to the effects mentioned above, and other effects not mentioned will be clearly understood by those skilled in the art from the descriptions below.

DETAILED DESCRIPTIONS

Figure 1:
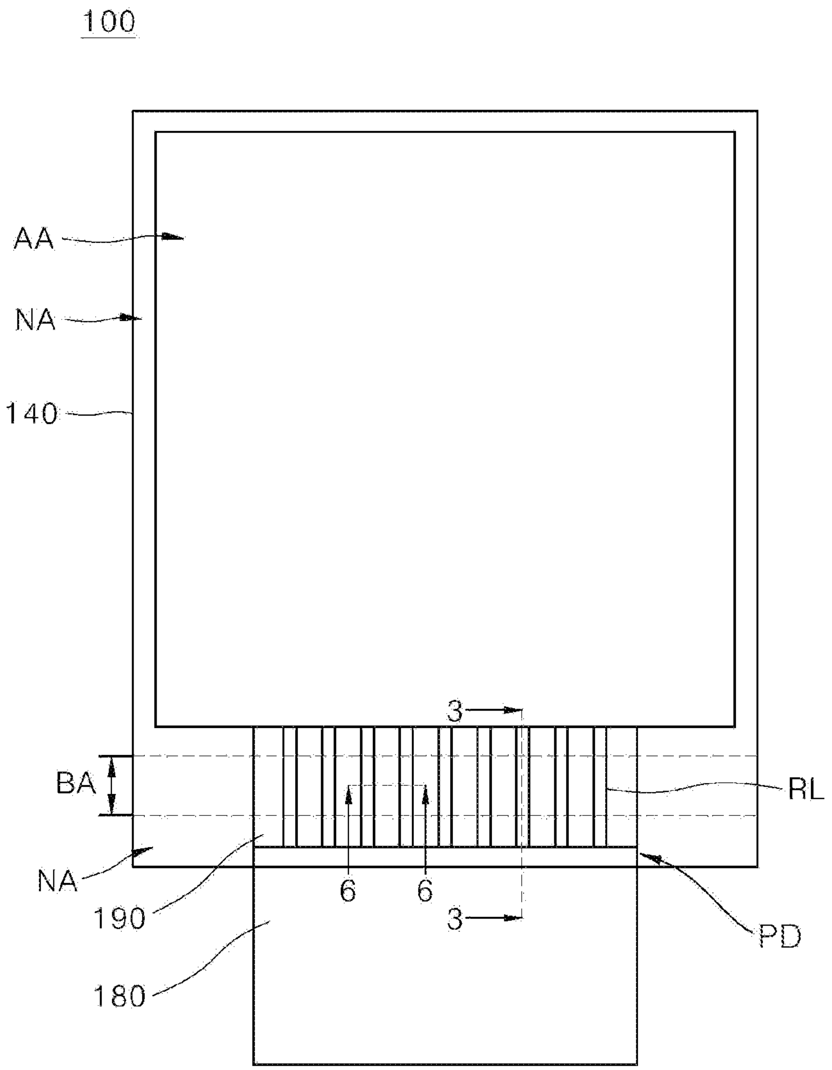
FIG. 1 is a plan view illustrating a state in which a display apparatus according to an embodiment of the present disclosure is not bent.

Advantages and features of the present disclosure, and a method of achieving the advantages and features will become apparent with reference to embodiments described later in detail together with the accompanying drawings. However, the present disclosure is not limited to the embodiments as disclosed under, but may be implemented in various different forms. Thus, these embodiments are set forth only to make the present disclosure complete, and to completely inform the scope of the present disclosure to those of ordinary skill in the technical field to which the present disclosure belongs.

A shape, a size, a ratio, an angle, a number, etc. disclosed in the drawings for describing the embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like may be disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like may be disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is indicated.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described under could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

In interpreting a numerical value, the value is interpreted as including an error range unless there is separate explicit description thereof.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

The features of the various embodiments of the present disclosure may be partially or entirely combined with each other, and may be technically associated with each other or operate with each other. The embodiments may be implemented independently of each other and may be implemented together in an association relationship.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, display apparatuses according to embodiments according to the present disclosure will be described in detail with reference to the accompanying drawings.

Figure 2:
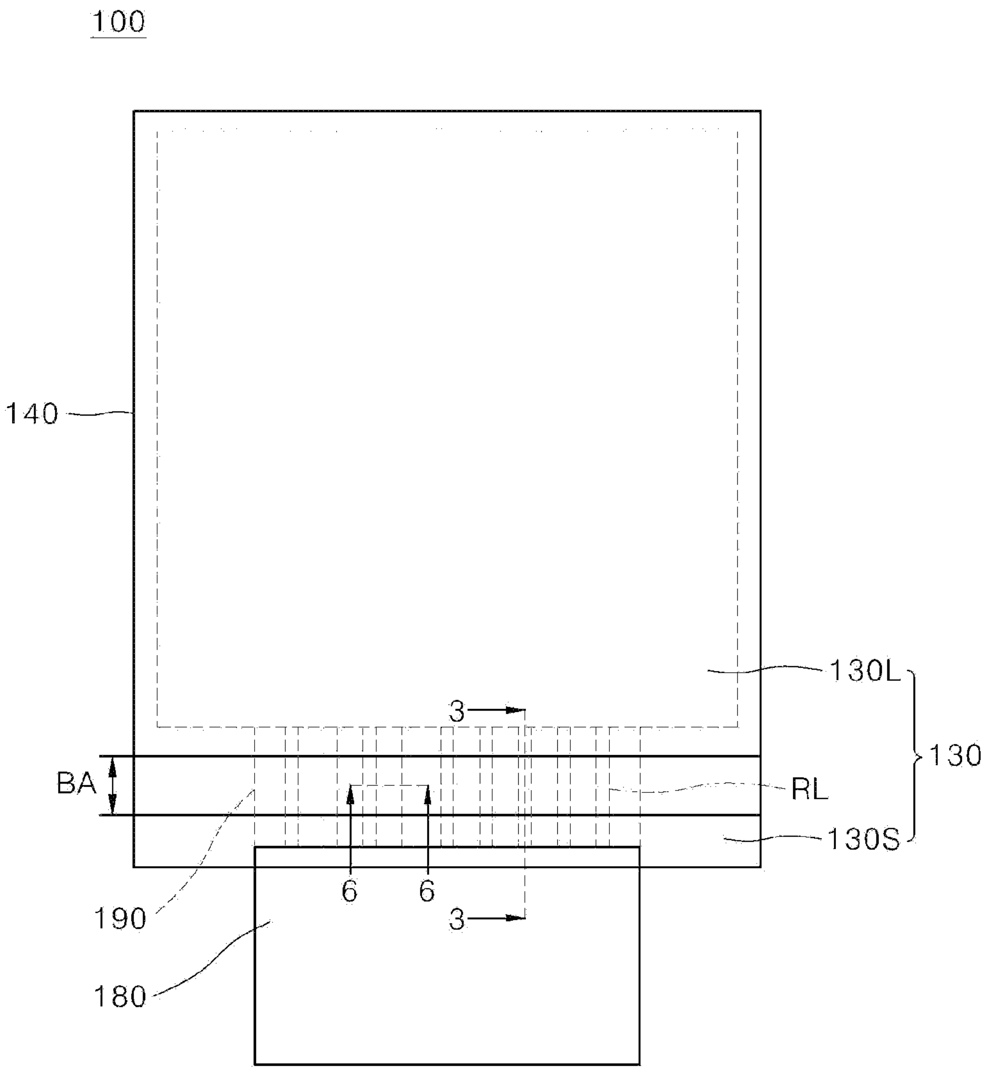
FIG. 2 is a rear view showing a state in which the display apparatus according to an embodiment of the present disclosure is not bent.
Figure 3:
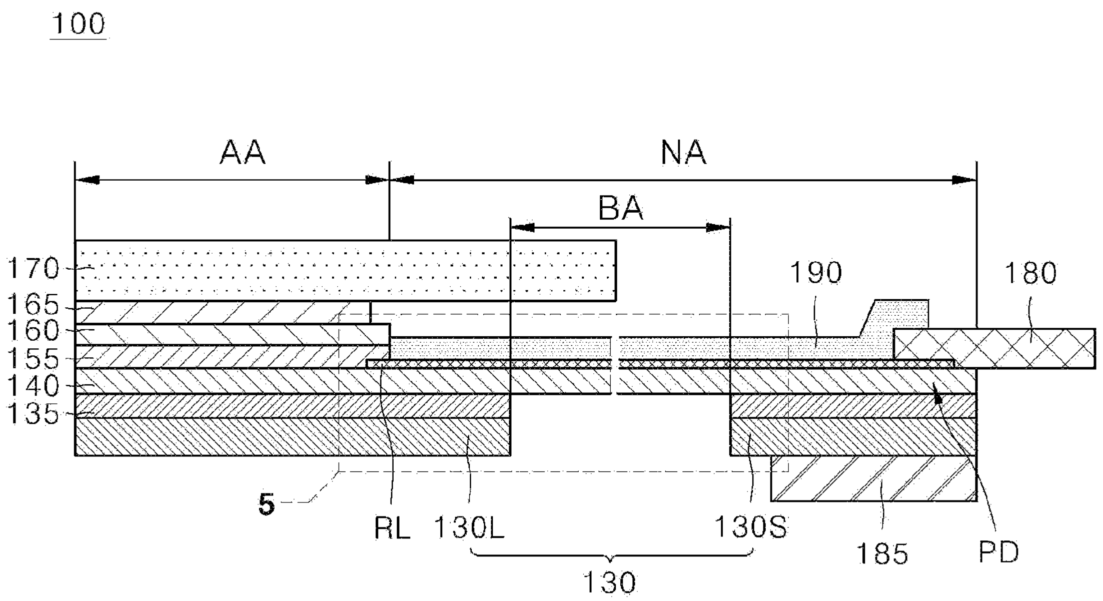
FIG. 3 is a cross-sectional view taken along a '3-3 line' of FIG. 1.
Figure 4:
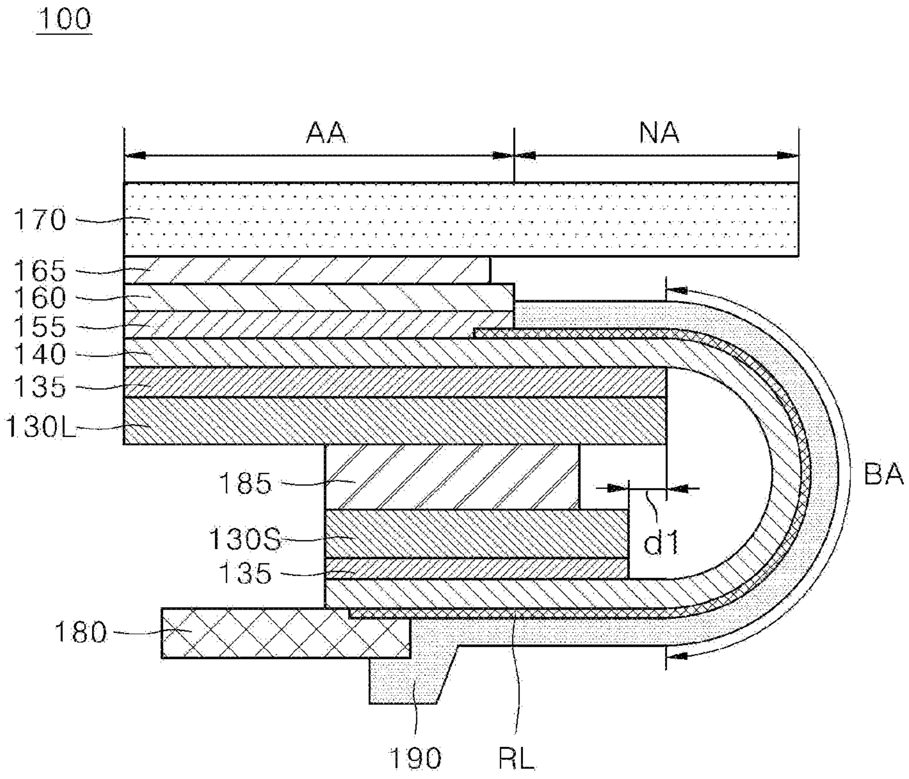
FIG. 4 is a cross-sectional view showing a bent state of the display apparatus in FIG. 3.

FIG. 1 is a plan view illustrating a state in which a display apparatus according to an embodiment of the present disclosure is not bent. FIG. 2 is a rear view showing a state in which the display apparatus according to an embodiment of the present disclosure is not bent. FIG. 3 is a cross-sectional view taken along a '3-3 line' of FIG. 1. FIG. 4 is a cross-sectional view showing a bent state of the display apparatus in FIG. 3.

Referring to FIG. 1 and FIG. 2, a display panel 140 of a display apparatus 100 according to an embodiment of the present disclosure may include a display area AA where an image is displayed and a non-display area NA disposed around the display area AA. The non-display area NA may include a bendable area BA in which the display panel 140 can be bent and a pad PD coupled to an external driving module.

The display panel 140 may be a flexible display panel including a plurality of pixels formed on a flexible substrate. For example, the display apparatus 100 may be a foldable display apparatus in which the display panel 140 is foldable.

The display area AA of the display panel 140 is an area where a plurality of pixels are disposed to display an image. Each pixel may include a plurality of sub-pixels. Each sub-pixel is an individual unit that emits light, and may emit, for example, red, green, blue, or white light. However, the present disclosure is not limited thereto. A light-emitting element and pixel circuit for driving the light-emitting element may be disposed in each sub-pixel of the display area AA. The pixel circuit may include at least one thin-film transistor and at least one capacitor. The light-emitting element may be embodied as, for example, an organic light-emitting diode or an inorganic light-emitting diode.

The non-display area NA of the display panel 140 is an area where an image is not displayed, and is an area where a driving circuit and various lines for driving the plurality of sub-pixels disposed in the display area AA are disposed. For example, a gate driver circuit may be disposed in the non-display area NA. The gate driver circuit may be directly formed in the non-display area NA of the display panel 140. In one embodiment, a data driver circuit may be further disposed in the non-display area NA. The data driver circuit may be embodied as an IC chip and mounted in the non-display area NA of the display panel 140, or directly formed in the non-display area NA of the display panel 140.

As shown in FIG. 1 and FIG. 2, the non-display area NA may be an area surrounding an edge of the display area AA. In FIG. 1 and FIG. 2, it is shown that the non-display area NA surrounds a rectangular display area AA. However, the present disclosure is not limited thereto. Each of the display area AA and the non-display area NA may have a form suitable for a design of an electronic apparatus on which the display apparatus 100 is mounted. An example of the shape of the display area AA may be pentagonal, hexagonal, circular, elliptical, etc. However, the present disclosure is not limited thereto.

The pad PD may be disposed on one side of the non-display area NA, and an external driving module 180 may be coupled to the pad PD. The external driving module may include, for example, a flexible printed circuit board on which a timing controller and a power management IC chip are mounted.

The bendable area BA is a portion of the non-display area NA, and may be located, for example, on one side of the display area AA and between the display area AA and the pad PD. The bendable area BA is a portion of the non-display area NA that may be bent such that the external driving module 180 coupled to the pad PD is disposed under the display panel 140.

Signal lines RL connected to the display area AA may extend across the bendable area BA of the non-display area NA and then be connected to the pad PD.

When the pad PD of the display panel 140 and the external driving module 180 are disposed under the display panel 140 as the non-display area NA of the display panel 140 is bent, a size of the non-display area NA that is recognized by the user when the user views the display panel 140 from a position above the display panel 140 in the plan view may be reduced so that a narrow bezel may be implemented.

A backplate 130 is attached to a lower surface of the display panel 140. The backplate 130 is attached to an area of the display panel 140 other than the bendable area BA so that the bendable area BA of the display panel 140 is easily bent and has a small radius of curvature. The backplate 130 may include a first backplate 130L and a second backplate 130S spaced apart from each other by a width of the bendable area BA. An area between the first backplate 130L and the second backplate 130S may correspond to the bendable area BA. An end of the first backplate 130L in the non-display area NA may be one side boundary of the bendable area BA, and an end of the second backplate 130S facing the end of the first backplate 130L in the non-display area NA may be the other side boundary of the bendable area BA. The first backplate 130L may support the display area AA and a portion of the non-display area NA adjacent to the display area AA, while the second backplate 130S may support a portion of the non-display area NA where the pad PD is disposed.

Each of the first and second backplates 130L and 130S may be composed of a polymer film. The polymer film that may constitute each of the first and second backplates 130L and 130S may be made of, for example, polyimide (PI), polyethylene terephthalate (PET), polycarbonate (PC), or polyethylene naphthalate (PEN). However, the present disclosure is not limited thereto.

Referring to FIGS. 3 and 4, in the display area AA of the display panel 140, a polarization layer 160 may be attached to an upper surface of the display panel 140 via an adhesive layer 155. The polarization layer 160 may be disposed on the display panel 140 to prevent reflection of light introduced from the outside, thereby improving visibility of the display panel 140 outdoors. The polarization layer 160 may include a polarizer and a phase retardation layer.

A cover window 170 may be attached to the polarization layer 160 via an adhesive layer 165.

The cover window 170 may be composed of tempered glass or plastic film having impact resistance and light transmittance in order to protect the display panel 140 from external impact, moisture, and heat. In order to satisfy strength characteristics and folding characteristics, the cover window 170 may be formed to have a thickness of 30 to 200 μm.

When the cover window 170 is composed of a plastic film, the plastic film may made of polyimide (PI), polyethylene terephthalate (PET), polypropylene glycol (PPG), and polycarbonate (PC), etc.

When the cover window 170 is made of the tempered glass, the cover window 170 may be broken by external force or stress. In this regard, in order to prevent fragments of the cover window 170 from scattering, an anti-scattering film may be attached to an upper surface of the cover window 170. The anti-scattering film may include, for example, a base film including polyethylene terephthalate (PET), colorless polyimide (CPI), or a stack of a polyethylene terephthalate (PET) film and a color polyimide (CPI) film. A hard coating layer, an antireflective layer, an anti-fingerprint layer, and the like may be coated on an upper surface of the base film.

Each of the adhesive layers 155 and 165 may be made of a pressure-sensitive adhesive including an optical clear adhesive.

In the non-display area NA of the display panel 140, the external driving module 180 may be coupled to the pad PD on the upper surface of the display panel 140, and a micro coating layer 190 covering at least the bendable area BA may be disposed.

The micro coating layer 190 may be disposed in an area between the display area AA of the display panel 140 and the external driving module 180 so as to cover the signal lines RL disposed in the non-display area NA of the display panel 140.

The micro coating layer 190 may prevent penetration of moisture into the signal lines RL while protecting the signal lines RL from external impact. To inhibit penetration of the moisture, one or more getter materials may be added into the micro coating layer 190. Further, the micro coating layer 190 may supplement rigidity of the display panel 140 in the bendable area BA where the backplate is not disposed.

Then, the micro coating layer 190 may have a predetermined thickness to adjust a position of a neutral plane of the bendable area BA. When the micro coating layer 190 is disposed on the bendable area BA, the neutral plane may be controlled to be closer to the signal lines RL. Adjusting the position of the neutral plane of the bendable area BA in this way may allow the stress applied to the signal lines RL to be reduced when the display panel 140 is bent, thereby suppressing cracks occurring in the signal lines RL.

One end of the micro coating layer 190 may contact the polarization layer 160. This may prevent moisture from penetrating into a space between the micro coating layer 190 and the polarization layer 160 to cause cracks and disconnection of the signal lines RL.

The other end of the micro coating layer 190 may cover a portion of the external driving module 180. This may prevent moisture from penetrating into a space between the external driving module 180 and the pad PD of the display panel 140 to cause cracks and disconnection of the signal lines RL.

Since the micro coating layer 190 is disposed in the non-display area NA including the bendable area BA, it is desirable for the micro coating layer 190 to have a flexible ability. The micro coating layer 190 may be made of, for example, an acrylic resin such as acrylate polymer. However, the present disclosure is not limited thereto.

The first backplate 130L and the second backplate 130S may be attached to a lower surface of the display panel 140 via an adhesive layer 135.

The adhesive layer 135 may be made of a pressure-sensitive adhesive including an optically clear adhesive.

An adhesive member 185 may be disposed on a lower surface of the second backplate 130S. The adhesive member 185 may be embodied as a pressure sensitive adhesive or a double sided tape.

As shown in FIG. 4, in a state where the bendable area BA of the display panel 140 is bent such that the external driving module 180 is disposed under the display panel 140, the second backplate 130S may be attached and fixed to a lower surface of the first backplate 130L via the adhesive member 185.

In a state where the second backplate 130S is attached to the lower surface of the first backplate 130L, a distance d1 between an end of the first backplate 130L and an end of the second backplate 130S adjacent to each other in the non-display area NA is preferably 10 μm or smaller. This is because the stress applied to the signal lines RL increases as the distance d1 between the end of the first backplate 130L and the end of the second backplate 130S in the non-display area NA exceeds 10 μm. Most preferably, the end of the first backplate 130L coincides with the end of the second backplate 130S in the non-display area NA.

Figure 5:
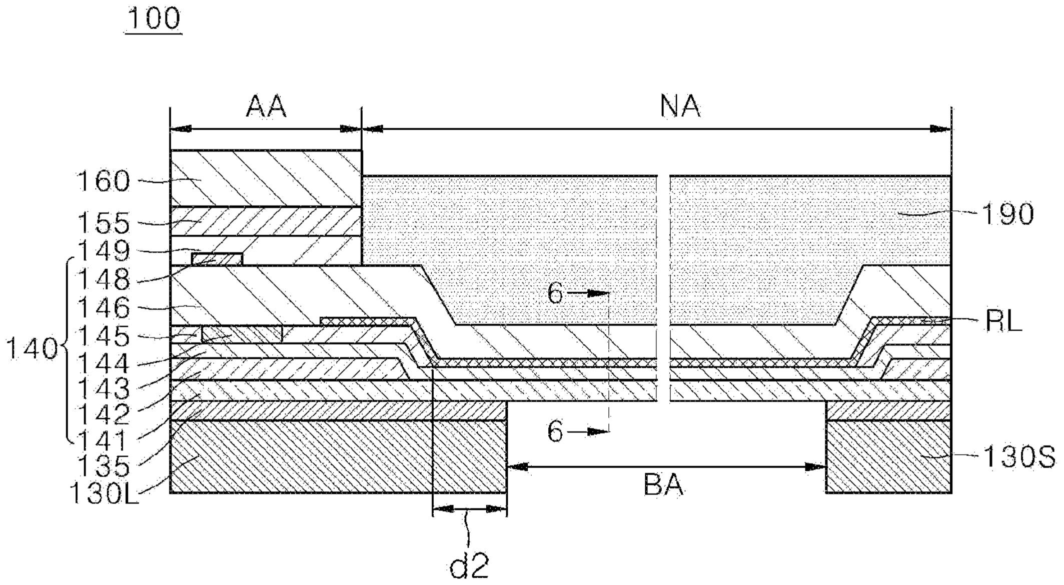
FIG. 5 is a cross-sectional view showing a partial area of FIG. 3.
Figure 6:
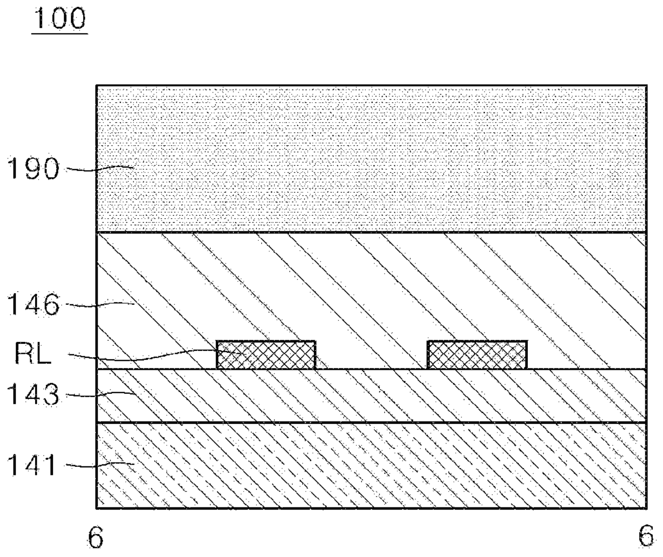
FIG. 6 is a cross-sectional view taken along a '6-6 line' of FIGS. 1 and 5.

FIG. 5 is a cross-sectional view showing a partial area of FIG. 3. FIG. 6 is a cross-sectional view taken along a '6-6 line' of FIGS. 1 and 5.

Referring to FIG. 5 and FIG. 6, the display apparatus 100 according to an embodiment of the present disclosure may include the display panel 140, the polarization layer 160, the first and second backplates 130L, 130S, and the micro coating layer 190.

The display panel 140 may include a buffer layer 142, an adhesive buffer layer 143, a pixel circuit 144, a planarization layer 145, an insulating layer 146, a light-emitting element 148, and an encapsulation layer 149 which are disposed on a substrate 141.

The substrate 141 may include a flexible polymeric material. For example, the substrate 141 may be made of a polymer material such as polyimide, polyethylene terephthalate, polyethylene naphthalate, polycarbonate, polyethersulfone, polyarylate, polysulfone, cyclic-olefin copolymer, etc. In one embodiment, the substrate 141 may be composed of a single layer made of polyimide and having a thickness of about 5 μm to 15 μm, for example.

The buffer layer 142 may be disposed on the substrate 141. The buffer layer 142 may prevent penetration of moisture, oxygen or impurities through the substrate 141. The buffer layer 142 may be located in the display area AA of the display apparatus 100. The buffer layer 142 may be disposed in a portion of the non-display area NA of the display apparatus 100, but may not be disposed in the bendable area BA.

The buffer layer 142 may be embodied as a single layer or a stack of multiple layers made of an inorganic insulating material such as, for example, silicon nitride, silicon oxide, or silicon oxynitride. However, the present disclosure is not limited thereto.

The adhesive buffer layer 143 may be disposed on the buffer layer 142. The adhesive buffer layer 143 may be disposed over an entirety of the display area AA and the non-display area NA of the display panel 140. The adhesive buffer layer 143 may be directly disposed on the upper surface of the substrate 141 in the bendable area BA of the display panel 140.

The adhesive buffer layer 143 may be made of, for example, acryl-based, silicone-based, rubber-based, or polyurethane-based adhesive material. However, the present disclosure is not limited thereto. The adhesive buffer layer 143 may have a lower storage modulus than that of the polymer material of the substrate 141. In one embodiment, the adhesive buffer layer 143 may have a storage modulus ranging from 0.01 MPa to 1,000 MPa at 25° C. In another embodiment, the adhesive buffer layer 143 may have a storage modulus ranging from 0.01 MPa to 50 MPa at 25° C. The adhesive buffer layer 143 may have a thickness of 0.5 μm to 3.0 μm.

The pixel circuit 144 may be disposed on the adhesive buffer layer 143 and in the display area AA. The pixel circuit 144 may drive and switch the light-emitting element 148 disposed in the display area AA.

The pixel circuit 144 may include at least one thin-film transistor using an amorphous silicon semiconductor, a polycrystalline silicon semiconductor, or an oxide semiconductor, and at least one storage capacitor. At least one thin-film transistor may include at least one driving thin-film transistor and at least one switching thin-film transistor. When the pixel circuit 144 includes the thin-film transistor (TFT), the pixel circuit 144 may be formed using a TFT manufacturing process.

The pixel circuit 144 may be embodied as a pixel driver chip manufactured on a single crystal semiconductor substrate using a MOSFET manufacturing process. A pixel driver chip may include a plurality of circuit units, and each circuit unit may include at least one driving transistor, at least one switching transistor, and at least one storage capacitor. For example, the pixel driver chip may have a size of 1 to 500 μm and may be referred to as a micro driver chip. The pixel driver chip may include various input pads and output pads.

The planarization layer 145 surrounding a side surface of the pixel circuit 144 may be disposed on the adhesive buffer layer 143 and in the display area AA. In one embodiment, the planarization layer 145 may cover an upper surface of the pixel circuit 144. The planarization layer 145 may be disposed in a portion of the non-display area NA of the display apparatus 100, but may not be disposed in the bendable area BA. An end of the planarization layer 145 in the non-display area NA may be located closer to the bendable area BA than an end of the buffer layer 142 in the non-display area NA. The end of the planarization layer 145 in the non-display area NA may be spaced apart from the bendable area BA by a predetermined distance.

In the non-display area NA, the end of the planarization layer 145 in the non-display area NA is preferably spaced from the end of the first backplate 130L in the non-display area NA by a distance d2 of 60 μm or larger. This is because when the spacing between the end of the planarization layer 145 and the end of the first backplate 130L in the non-display area NA is smaller than 60 μm, a larger amount of stress than an amount of stress applied to the signal lines RL in the bendable area BA is applied to the signal lines RL at the end of the planarization layer 145. Therefore, the spacing between the end of the planarization layer 145 and the end of the first backplate 130L in the non-display area NA may be equal to or larger than 60 μm, thereby preventing the larger amount of stress than an amount of stress applied to the signal lines RL in the bendable area BA from being applied to the signal lines RL at the end of the planarization layer 145.

The planarization layer 145 may be made of an organic insulating material. The planarization layer 145 may be made of, for example, photosensitive photo acryl or photosensitive polyimide. However, the present disclosure is not limited thereto.

The signal lines RL may be disposed on the planarization layer 145. The signal lines RL may be disposed in a portion of the display area AA and the non-display area NA including the bendable area BA. The signal lines RL may extend from the display area AA to the bendable area BA, and may extend across the bendable area BA, and be connected to the pad PD of the non-display area NA. The signal lines RL may be directly disposed on the adhesive buffer layer 143 and in the bendable area BA.

Each of the signal lines RL may be made of a single-layer or a multi-layer structure of made of titanium (Ti), tantalum (Ta), aluminum (Al), copper (Cu), molybdenum (Mo), chromium (Cr), nickel (Ni), neodymium (Nd), silver (Ag), gold (Au), or the like. Each of the signal lines RL may have, for example, a 3-layer structure of a Ti layer/an Al layer/a Ti layer.

The insulating layer 146 covering the signal lines RL may be disposed on the planarization layer 145 and the pixel circuit 144. The insulating layer 146 may be disposed over the entirety of the display area AA and the non-display area NA of the display panel 140. The insulating layer 146 may be disposed on the adhesive buffer layer 143 while covering the signal lines RL in the bendable area BA of the display panel 140. The insulating layer 146 may be embodied as a single layer, or may include a plurality of layers.

The insulating layer 146 may be made of an organic insulating material. The insulating layer 146 may be made of, for example, photosensitive photo acryl or photosensitive polyimide. However, the present disclosure is not limited thereto. The insulating layer 146 may have a thickness of 6 μm to 10 μm.

The insulating layer 146 may be disposed on the bendable area BA such that a location of the neutral plane may be adjusted so as to be closer to the signal lines RL. Adjusting the position of the neutral plane of the bendable area BA in this way may allow the stress applied to the signal lines RL to be reduced when the display panel 140 is bent, thereby suppressing the occurrence of cracks in the signal lines RL.

At least one light-emitting element 148 may be disposed on the insulating layer 146 and in the display area AA.

At least one connection electrode (not shown) extending through the insulating layer 146 so as to connect the light-emitting element 148 and the pixel circuit 144 to each other may be disposed between the light-emitting element 148 and the pixel circuit 144. When the insulating layer 146 includes a plurality of layers, there may be a plurality of connection electrodes extending through the plurality of layers, respectively.

The encapsulation layer 149 covering the light-emitting element 148 may be disposed on the insulating layer 146. The encapsulation layer 149 may include at least one of an organic insulating material or an inorganic insulating material.

The polarization layer 160 may be disposed on the encapsulation layer 149. The polarization layer 160 may include a polarizer layer and a phase retardation layer.

The micro coating layer 190 may be disposed on the insulating layer 146 and in the non-display area NA. The micro coating layer 190 may be disposed on the non-display area NA so as to cover the bendable area BA. One end of the micro coating layer 190 may contact the polarization layer 160.

In this embodiment, the adhesive buffer layer 143 having a lower storage modulus than that of the polymer material of the substrate 141 is disposed between the substrate 141 and the signal lines RL and in the bendable area BA of the display panel 140. Thus, when the bendable area BA of the display panel 140 is bent, slip or shear deformation may occur between the substrate 141 and the signal lines RL, and the stress applied to the signal lines RL may be reduced. Accordingly, cracks and disconnection defects of the signal lines RL may be reduced or prevented.

Figure 7:
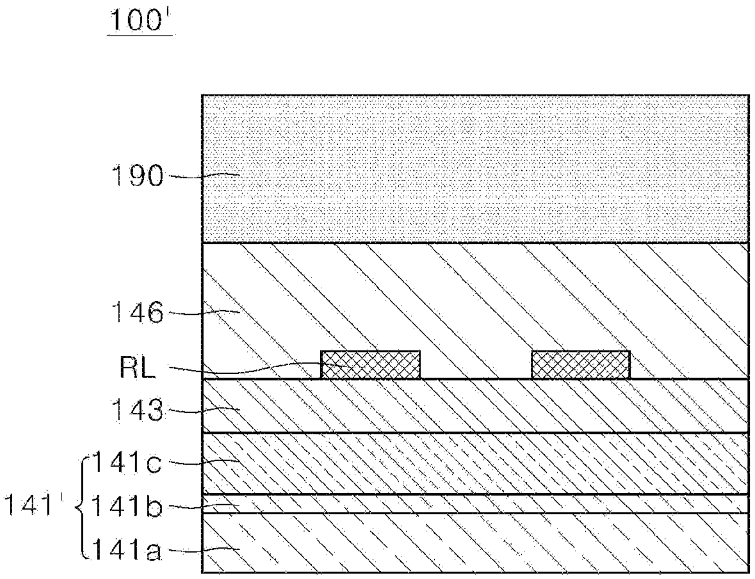
FIG. 7 is a cross-sectional view according to an embodiment of the present disclosure, and shows an area corresponding to an area shown in FIG. 6.

FIG. 7 is a cross-sectional view according to an embodiment of the present disclosure, and shows an area corresponding to an area shown in FIG. 6.

Referring to FIG. 7, unlike FIG. 6, a substrate 141' may include a lower layer 141*a*, a middle layer 141*b*, and an upper layer 141*c*. The substrate 141' may have a stack structure in which the middle layer 141*b* is inserted between the lower layer 141*a* and the upper layer 141*c*. Each of the lower layer 141*a* and the upper layer 141*c* may be made of, for example, a polymer material such as polyimide, polyethylene terephthalate, polyethylene naphthalate, polycarbonate, polyethersulfone, polyarylate, polysulfone, or a cyclic-olefin copolymer. The middle layer 141*b* may be composed of a single layer or a stack structure of layers made of an inorganic material such as silicon oxide (SiOx), silicon nitride (SiNx), or silicon oxynitride (SiOxNy).

The adhesive buffer layer 143 may be disposed on the substrate 141', and the signal lines RL may be directly disposed on the adhesive buffer layer 143. The insulating layer 146 may be disposed on the adhesive buffer layer 143 so as to cover the signal lines RL. The micro coating layer 190 may be disposed on the insulating layer 146.

In this embodiment, the adhesive buffer layer 143 having a lower storage modulus than that of the polymer material of the substrate 141' is disposed between the substrate 141' and the signal lines RL and in the bendable area BA of the display panel 140. Thus, when bending the bendable area BA of the display panel 140, slip or shear deformation may occur between the substrate 141' and the signal lines RL, and the stress applied to the signal lines RL may decrease. Accordingly, cracks and disconnection defects of the signal lines RL may be reduced or prevented.

Figure 8:
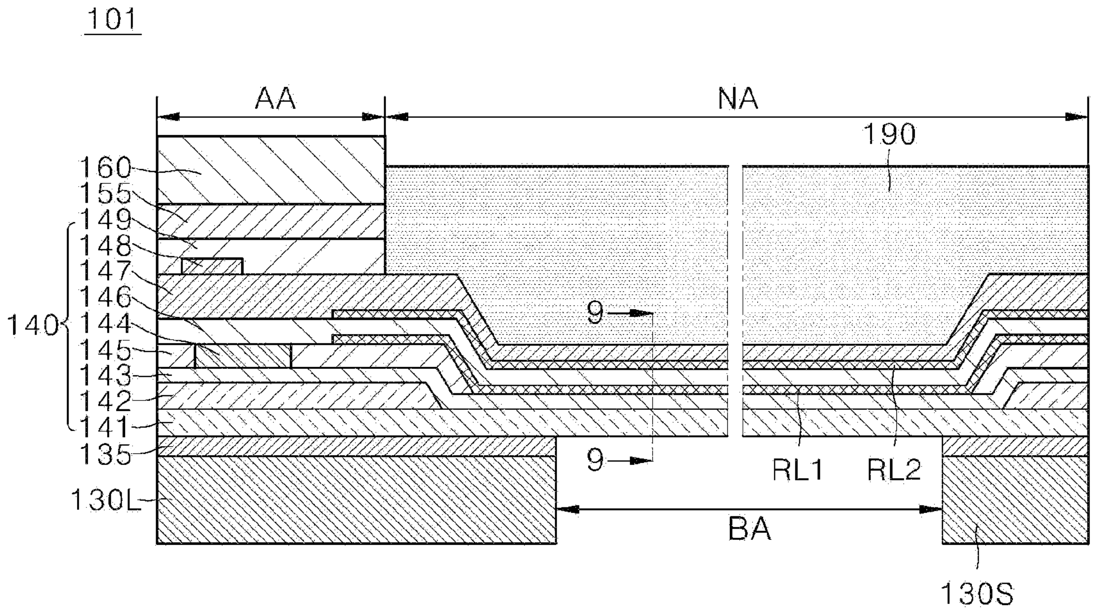
FIG. 8 is a cross-sectional view according to an embodiment of the present disclosure, and shows an area corresponding to an area shown in FIG. 5.
Figure 9:
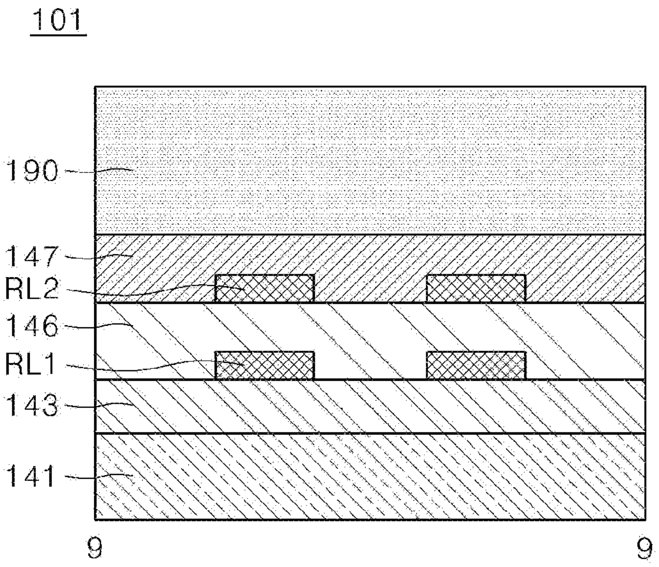
FIG. 9 is a cross-sectional view taken along a 'line 9-9' of FIG. 8.

FIG. 8 is a cross-sectional view according to an embodiment of the present disclosure, and shows an area corresponding to an area shown in FIG. 5. FIG. 9 is a cross-sectional view taken along a 'line 9-9' of FIG. 8. Hereinafter, with reference to FIGS. 8 and 9, only differences of this embodiment from the embodiments of FIGS. 5 and 6 will be described.

Referring to FIGS. 8 and 9, first signal lines RL1 and the first insulating layer 146 may be disposed on the planarization layer 145. Further, second signal lines RL2 and a second insulating layer 147 may be disposed on the first insulating layer 146.

The first signal lines RL1 and the second signal lines RL2 may be disposed in a portion of the display area AA and the non-display area NA including the bendable area BA. The first signal lines RL1 and the second signal lines RL2 may extend from the display area AA to the bendable area BA and extend across the bendable area BA so as to be connected to the pad PD of the non-display area NA.

The first signal lines RL1 may be directly disposed on the adhesive buffer layer 143 and in the bendable area BA. The second signal lines RL2 may be disposed so as to overlap with the first signal lines RL1. However, the present disclosure is not limited thereto. Each of the second signal lines RL2 may be disposed between adjacent ones of the first signal lines RL1 in a plan view of the apparatus.

Each of the first signal lines RL and the second signal lines RL2 may be made of a single-layer or a multi-layer structure of made of titanium (Ti), tantalum (Ta), aluminum (Al), copper (Cu), molybdenum (Mo), chromium (Cr), nickel (Ni), neodymium (Nd), silver (Ag), gold (Au), or the like. Each of the first signal lines RL and the second signal lines RL2 may have, for example, a 3-layer structure of a Ti layer/an Al layer/a Ti layer.

Each of the first insulating layer 146 and the second insulating layer 147 may be disposed along an entirety of the display area AA and the non-display area NA of the display panel 140. The first insulating layer 146 may be disposed on the adhesive buffer layer 143 while covering the first signal lines RL1 in the bendable area BA of the display panel 140. The second insulating layer 147 may cover the second signal lines RL2 in the bendable area BA of the display panel 140 and may be disposed on the first insulating layer 146.

The second signal lines RL2 may respectively deliver the same signals as the corresponding first signal lines RL1.

One signal line may be used to transmit one signal. In this case, when a crack occurs in the corresponding signal line, the corresponding signal may not be delivered.

However, according to the present embodiment, the first signal lines RL1 and the second signal lines RL2 may be disposed in the bendable area BA of the display apparatus 101. Thus, even when one signal line is broken, the delivery of the corresponding signal may be guaranteed.

Further, in this embodiment, the adhesive buffer layer 143 having a lower storage modulus than that of the polymer material of the substrate 141 is disposed between the substrate 141 and the first signal lines RL1 and in the bendable area BA of the display panel 140. When bending the bendable area BA of the display panel 140, slip or shear deformation may occur between the substrate 141 and the first signal lines RL1, and the stress applied to the first signal lines RL1 and the second signal lines RL2 may be reduced. Accordingly, cracks and disconnection defects of the first signal lines RL1 and the second signal lines RL2 may be reduced or prevented.

Figure 10:
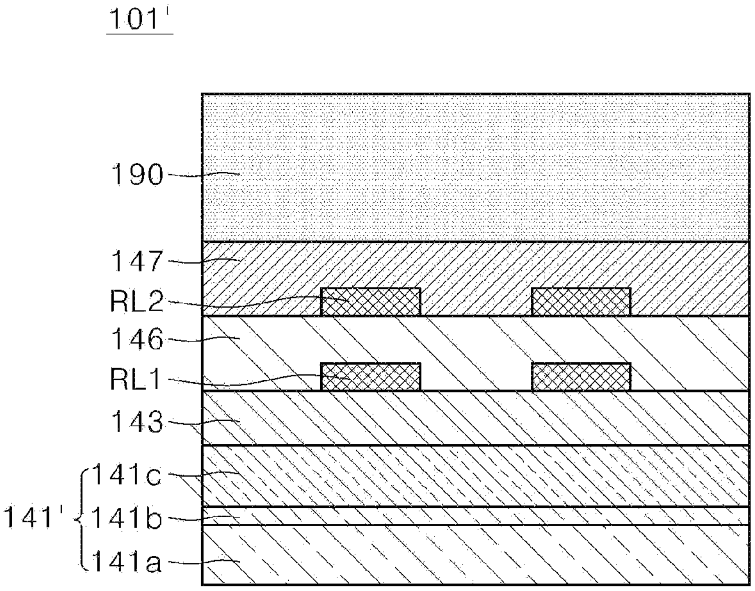
FIG. 10 is a cross-sectional view according to an embodiment of the present disclosure, and shows an area corresponding to an area shown in FIG. 9.

FIG. 10 is a cross-sectional view according to an embodiment of the present disclosure, and shows an area corresponding to an area shown in FIG. 9.

Referring to FIG. 10, unlike FIG. 9, the substrate 141' may include the lower layer 141*a*, the middle layer 141*b*, and the upper layer 141*c*. The substrate 141' may have a stack structure in which the middle layer 141*b* is inserted between the lower layer 141*a* and the upper layer 141*c*. Each of the lower layer 141*a* and the upper layer 141*c* may be made of, for example, a polymer material such as polyimide, polyethylene terephthalate, polyethylene naphthalate, polycarbonate, polyethersulfone, polyarylate, polysulfone, or a cyclic-olefin copolymer. The middle layer 141*b* may be composed of a single layer or a stack structure of layers made of an inorganic material such as silicon oxide (SiOx), silicon nitride (SiNx), or silicon oxynitride (SiOxNy). The inorganic material in the middle layer 141*b* prevents gas such as $H_2O$ and $O_2$ from penetrating the substrate 141'.

The adhesive buffer layer 143 may be disposed on the substrate 141', and the first signal lines RL1 may be directly disposed on the adhesive buffer layer 143. The first insulating layer 146 may be disposed on the adhesive buffer layer 143 so as to cover the first signal lines RL1. The second signal lines RL2 may be disposed on the first insulating layer 146. The second insulating layer 147 covering the second signal lines RL2 may be disposed. Further, the micro coating layer 190 may be disposed on the second insulating layer 147.

The second signal lines RL2 may respectively deliver the same signals as the corresponding first signal lines RL1. One signal line may be used to transmit one signal. In this case, when a crack occurs in the corresponding signal line, the corresponding signal may not be delivered. However, according to the present embodiment, the first signal lines RL1 and the second signal lines RL2 may be disposed in the bendable area BA of the display apparatus 101. Thus, even when one signal line is broken, the delivery of the corresponding signal may be guaranteed.

Moreover, in this embodiment, the adhesive buffer layer 143 having a lower storage modulus than that of the polymer material of the substrate 141' is disposed between the substrate 141' and the first signal lines RL1 and in the bendable area BA of the display panel 140. Thus, when bending the bendable area BA of the display panel 140, slip or shear deformation may occur between the substrate 141' and the first signal lines RL1, and the stress applied to the first signal lines RL1 and the second signal lines RL2 may be reduced. Accordingly, cracks and disconnection defects of the first signal lines RL1 and the second signal lines RL2 may be reduced or prevented.

A display apparatus according to the embodiments of the present disclosure may be described as follows.

One aspect of the present disclosure provides a display apparatus comprising: a display panel including a display area and a non-display area surrounding the display area, wherein the non-display area has a bendable area: a first backplate supporting the display area of the display panel: and a second backplate spaced apart from the first backplate and supporting a portion of the non-display area of the display panel, wherein the display panel includes: a substrate; an adhesive buffer layer disposed on the substrate and in an entirety of each of the display area and the non-display area: and first signal lines disposed on the adhesive buffer layer and extending across the bendable area, wherein the adhesive buffer layer is disposed on an upper surface of the substrate and in the bendable area.

According to some implementations of the present disclosure, the adhesive buffer layer has a storage modulus lower than a storage modulus of a polymer material constituting the substrate.

According to some implementations of the present disclosure, the adhesive buffer layer has a storage modulus in a range of 0.01 MPa to 1,000 MPa at 25° C.

According to some implementations of the present disclosure, the adhesive buffer layer has a thickness in a range of 0.5 μm to 3.0 μm.

According to some implementations of the present disclosure, the adhesive buffer layer is made of one of acryl-based, silicon-based, rubber-based, or polyurethane-based adhesive material or a combination thereof.

According to some implementations of the present disclosure, in a state where the bendable area of the display panel is bent such that the second backplate is attached to a lower surface of the first backplate, a distance between an end of the first backplate and an end of the second backplate adjacent to each other in the non-display area NA is 10 μm or smaller.

According to some implementations of the present disclosure, the display panel further includes: a pixel circuit disposed on the adhesive buffer layer and in the display area: and a planarization layer surrounding a side surface of the pixel circuit.

According to some implementations of the present disclosure, the planarization layer extends into the non-display area, wherein an end of the planarization layer in the non-display area is spaced apart from an end of the first backplate in the non-display area by a distance of 60 μm or larger.

According to some implementations of the present disclosure, the display panel further includes: a first insulating layer disposed on the adhesive buffer layer so as to cover the first signal lines, wherein the first insulating layer is disposed in an entirety of each of the display area and the non-display area: and second signal lines disposed on the first insulating layer and extending across the bendable area.

According to some implementations of the present disclosure, the substrate includes a single layer made of a polymer material, or includes a stack structure in which a middle layer made of an inorganic material is disposed between a lower layer made of a polymer material and an upper layer made of a polymer material.

According to another implementation, a display apparatus comprises a display panel including a first area, a second area, and a third, bendable area between the first area and the second area, a first backplate supporting the first area of the display panel, and a second backplate spaced apart from the first backplate and supporting the second area of the display panel, wherein the display panel includes a substrate, an adhesive buffer layer disposed on the substrate in the third, bendable area of the display panel, and first signal lines disposed on the adhesive buffer layer and extending across the third, bendable area.

Although the embodiments of the present disclosure have been described in more detail with reference to the accompanying drawings, the present disclosure is not necessarily limited to these embodiments, and may be modified in a various manner within the scope of the technical spirit of the present disclosure. Accordingly, the embodiments as disclosed in the present disclosure are intended to describe rather than limit the technical idea of the present disclosure, and the scope of the technical idea of the present disclosure is not limited by these embodiments. Therefore, it should be understood that the embodiments described above are not restrictive but illustrative in all respects.

What is claimed is:

1. A display apparatus comprising:

a display panel including a display area and a non-display area surrounding the display area, wherein the non-display area has a bendable area;

a first backplate supporting at least the display area of the display panel; and a second backplate spaced apart from the first backplate and supporting a portion of the non-display area of the display panel, wherein the display panel includes:

a substrate;

an adhesive buffer layer disposed on the substrate in the display area and the non-display area; and first signal lines disposed directly on the adhesive buffer layer and extending across the bendable area, wherein the adhesive buffer layer is disposed directly on an upper surface of the substrate in the bendable area, wherein the adhesive buffer layer has a storage modulus lower than a storage modulus of a polymer material constituting the substrate.

2. The display apparatus of claim 1, wherein the adhesive buffer layer has a storage modulus in a range of 0.01 MPa to 1,000 MPa at 25° C.

3. The display apparatus of claim 1, wherein the adhesive buffer layer has a thickness in a range of 0.5 μm to 3.0 μm.

4. The display apparatus of claim 1, wherein the adhesive buffer layer is made of one of acryl-based, silicone-based, rubber-based, or polyurethane-based adhesive material or a combination thereof.

5. The display apparatus of claim 1, wherein in a state where the bendable area of the display panel is bent such that the second backplate is attached to a lower surface of the first backplate, a distance between an end of the first backplate and an end of the second backplate adjacent to each other in the non-display area is 10 μm or smaller.

6. The display apparatus of claim 1, wherein the display panel further includes:

a pixel circuit disposed on the adhesive buffer layer in the display area; and a planarization layer surrounding a side surface of the pixel circuit.

7. The display apparatus of claim 6, wherein the planarization layer extends into the non-display area, wherein an end of the planarization layer in the non-display area is spaced apart from an end of the first backplate in the non-display area by a distance of 60 μm or greater.

8. The display apparatus of claim 1, wherein the display panel further includes:

a first insulating layer disposed on the adhesive buffer layer so as to cover the first signal lines, wherein the first insulating layer is disposed in an entirety of each of the display area and the non-display area; and second signal lines disposed on the first insulating layer and extending across the bendable area.

9. The display apparatus of claim 1, wherein the substrate includes a single layer made of a polymer material, or includes a stack structure in which a middle layer made of an inorganic material is disposed between a lower layer made of a first polymer material and an upper layer made of a second polymer material.

10. A display apparatus, comprising: a display panel including a first area, a second area, and a bendable area between the first area and the second area; a first backplate supporting the first area of the display panel; and a second backplate spaced apart from the first backplate and supporting the second area of the display panel, wherein the display panel includes: a substrate; an adhesive buffer layer disposed directly on the substrate in the bendable area of the display panel; and first signal lines disposed directly on the adhesive buffer layer and extending across the bendable area, wherein the adhesive buffer layer has a storage modulus lower than a storage modulus of a polymer material of the substrate.

11. The display apparatus of claim 10, wherein the adhesive buffer layer has a storage modulus in a range of 0.01 MPa to 1,000 MPa at 25° C.

12. The display apparatus of claim 10, wherein the adhesive buffer layer has a thickness in a range of 0.5 μm to 3.0 μm.

13. The display apparatus of claim 10, wherein the adhesive buffer layer is made of one of acryl-based, silicone-based, rubber-based, or polyurethane-based adhesive material or a combination thereof.

14. The display apparatus of claim 10, wherein in a state where the bendable area of the display panel is bent such that the second backplate is attached to a lower surface of the first backplate, a lateral distance between an end of the first backplate and an end of the second backplate adjacent to each other in the non-display area is 10 μm or smaller.

15. The display apparatus of claim 10, wherein the adhesive buffer layer is disposed in entirety of the first area, the second area, and the third area.

16. The display apparatus of claim 10, wherein the first area includes a display area of the display panel, and a non-display area of the display panel includes the second area and the third area.

17. The display apparatus of claim 10, wherein the display panel further includes:

a pixel circuit disposed on the adhesive buffer layer in the first area; and a planarization layer surrounding a side surface of the pixel circuit, wherein the planarization layer extends short of an end of the first backplate by a distance of 60 μm or greater.

18. The display apparatus of claim 10, wherein the display panel further includes:

a first insulating layer disposed on the adhesive buffer layer so as to cover the first signal lines; and second signal lines disposed on the first insulating layer and extending across the third, bendable area.

19. The display apparatus of claim 10, wherein the substrate includes a single layer made of a polymer material, or includes a stack structure in which a middle layer made of an inorganic material is disposed between a lower layer made of a first polymer material and an upper layer made of a second polymer material.

* * * * *